(12) United States Patent
Liao (10) Patent No.: US 7,402,066 B2
(45) Date of Patent: Jul. 22, 2008

(54) LOW INSERTION FORCE SOCKET WITH LEAD-IN MECHANISM BACKGROUND OF THE INVENTION

(75) Inventor: Fang-Jwu Liao, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/497,404

(22) Filed: Aug. 1, 2006

(65) Prior Publication Data

US 2007/0026719 A1 Feb. 1, 2007

(30) Foreign Application Priority Data

Aug. 1, 2005 (TW) .............................. 94126027 A (51) Int. Cl.
*H01R 13/625* (2006.01)
(52) U.S. Cl. ...................................... 439/342; 439/857
(58) Field of Classification Search ................. 439/342, 439/857
See application file for complete search history.

(56) References Cited

U.S. PATENT DOCUMENTS

| | | | | |
|---|---|---|---|---|
| 3,621,444 A | * | 11/1971 | Stein | 439/109 |
| 3,989,331 A | * | 11/1976 | Hanlon | 439/70 |
| 4,498,725 A | * | 2/1985 | Bright et al. | 439/342 |
| 5,151,039 A | * | 9/1992 | Murphy | 439/70 |
| 5,399,108 A | * | 3/1995 | Lu et al. | 439/682 |
| 6,045,416 A | * | 4/2000 | Sinclair | 439/857 |
| 6,267,615 B1 | * | 7/2001 | Lin | 439/342 |
| 6,454,617 B1 | * | 9/2002 | Chiu | 439/857 |
| 6,478,637 B1 | * | 11/2002 | Ohkita et al. | 439/857 |
| 6,824,414 B2 | * | 11/2004 | Whyne et al. | 439/342 |
| 7,137,841 B1 | * | 11/2006 | Liao et al. | 439/342 |
| 7,192,806 B2 | * | 3/2007 | Canella | 438/117 |
| 2005/0142920 A1 | * | 6/2005 | Hashimoto | 439/342 |

* cited by examiner

*Primary Examiner*—Neil Abrams
*Assistant Examiner*—Harshad C Patel
(74) *Attorney, Agent, or Firm*—Wei Te Chung (57) ABSTRACT

According to an embodiment of the present invention, a low insertion force socket (10) includes a dielectric housing (20) defining a number of through-holes extending through an upper surface (202) and a lower surface (204) thereof. The through-holes each include a passage (206) for retaining a terminal (30) and a circular lead-in channel (208) in communication with the passage. The lead-in channel has a diameter smaller than that of an associated passage.

16 Claims, 7 Drawing Sheets

LOW INSERTION FORCE SOCKET WITH LEAD-IN MECHANISM BACKGROUND OF THE INVENTION

BACKGROUND OF THE INVENTION

1. Field of the Invention

The present invention generally relates to the art of electrical connectors. And more particularly, one embodiment of the present invention relates to a low insertion force socket with lead-in mechanism for forming reliable electrical connection between a pin grid array package and a circuit substrate.

2. General Background

Low insertion force sockets are widely used in various electrical devices for forming electrical connection between a pin grid array integrated circuit package having a number of conductive pins arranged thereon and a circuit substrate. A low insertion force socket typically includes a dielectric housing having a number of passages and a number of conductive terminals residing in corresponding passages, respectively. Each terminal includes a base section secured in the passage, a pair of opposing spring arms extending upwardly from two lateral sides of the base section for resiliently clamping a pin of the pin grid array package therebetween, and a solder pad to be electrically connected to a circuit substrate.

However, in the prior designs, no lead-in mechanism is provided in the housing to ensure smooth mating of the pins of the pin grid array package and the terminals of the lower insertion force socket. When the pin grid array package is accidentally biased or offset from its normal or intended inserting direction central line due to improper manual operation, the rigid pins thereof may interfere with sidewalls of the passages or the spring arms of the terminals, which may cause damage to either the housing or the terminals.

Therefore, there is a heretofore unaddressed need in the industry to address the aforementioned deficiencies and inadequacies.

SUMMARY

According to one embodiment of the present invention, a low insertion force socket includes a dielectric housing having a number of through-holes extending through a top and a bottom surfaces thereof. The through-holes each include an upper narrow lead-in channel to compliantly receive a pin of a pin grid array package and a lower wide passage in communication with the lead-in channel to retain a terminal therein.

The embodiment of the present invention offers a low insertion force socket defining a number of lead-in channels, which can ensure desirable mating between the pins of the pin grid array package and the terminals of the low insertion force socket, so as to prevent the terminals from being damaged even in presence of improper insertion of the pin grid array package.

The present invention is illustrated by way of example and not limitation in the figures of the appended drawings, in which like references indicate identical elements, and in which:

DETAILED DESCRIPTION OF THE EMBODIMENT

In the following description, for purpose of explanation, numerous details are set forth in order to provide a thorough understanding of the embodiment of the present invention. However, it will be apparent to one skilled in the art that these specific details are not required in order to practice the embodiment of the present invention.

Referring to FIG. 1 through FIG. 4, a low insertion force socket 10 according to one embodiment of the present invention includes a dielectric housing 20 defining a number of through-holes (not labeled) extending throughout an upper surface 202 and a lower surface 204 thereof. Each through-hole includes an upper narrow lead-in channel 210 for compliantly receiving a pin 50 of a pin grid array package (not shown) and a lower wide passage 206 in communication with the lead-in channel 208 for retaining a conductive terminal 30 therein.

Figure 5:
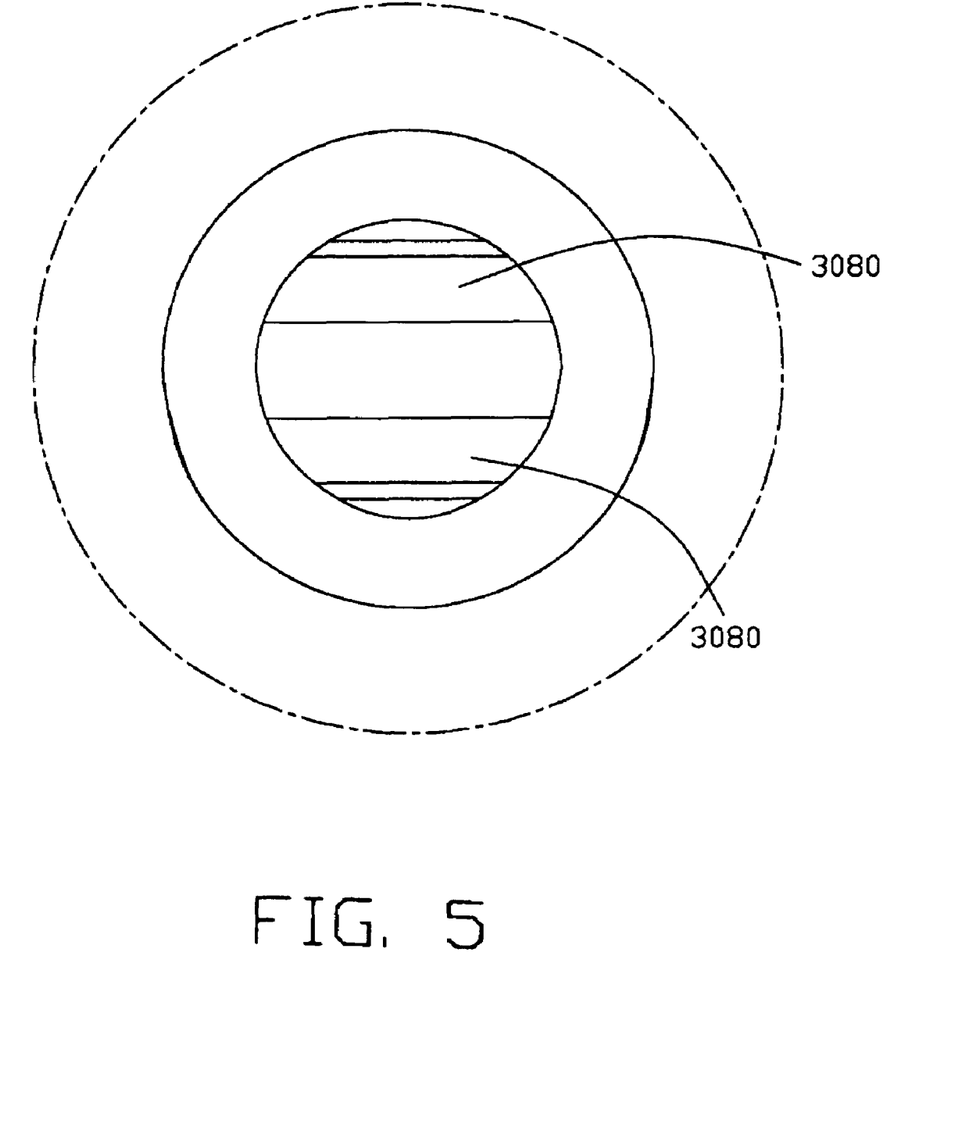
FIG. 5 depicts an exemplary enlarged, plan view of a circled portion V of the low insertion force socket shown in FIG. 1.
Figure 6:
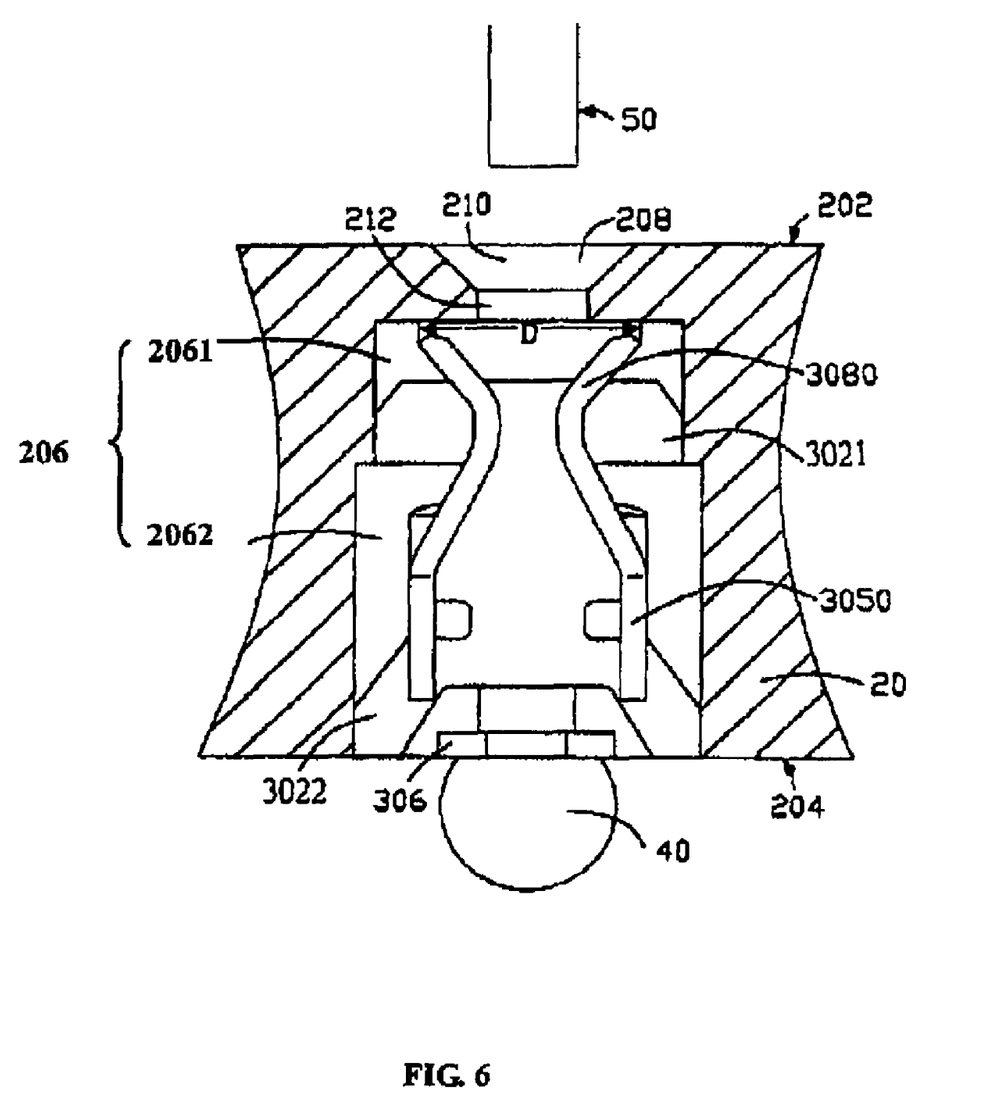
FIG. 6 depicts an exemplary cross-sectional view of the low insertion force socket of FIG. 1.
Figure 7:
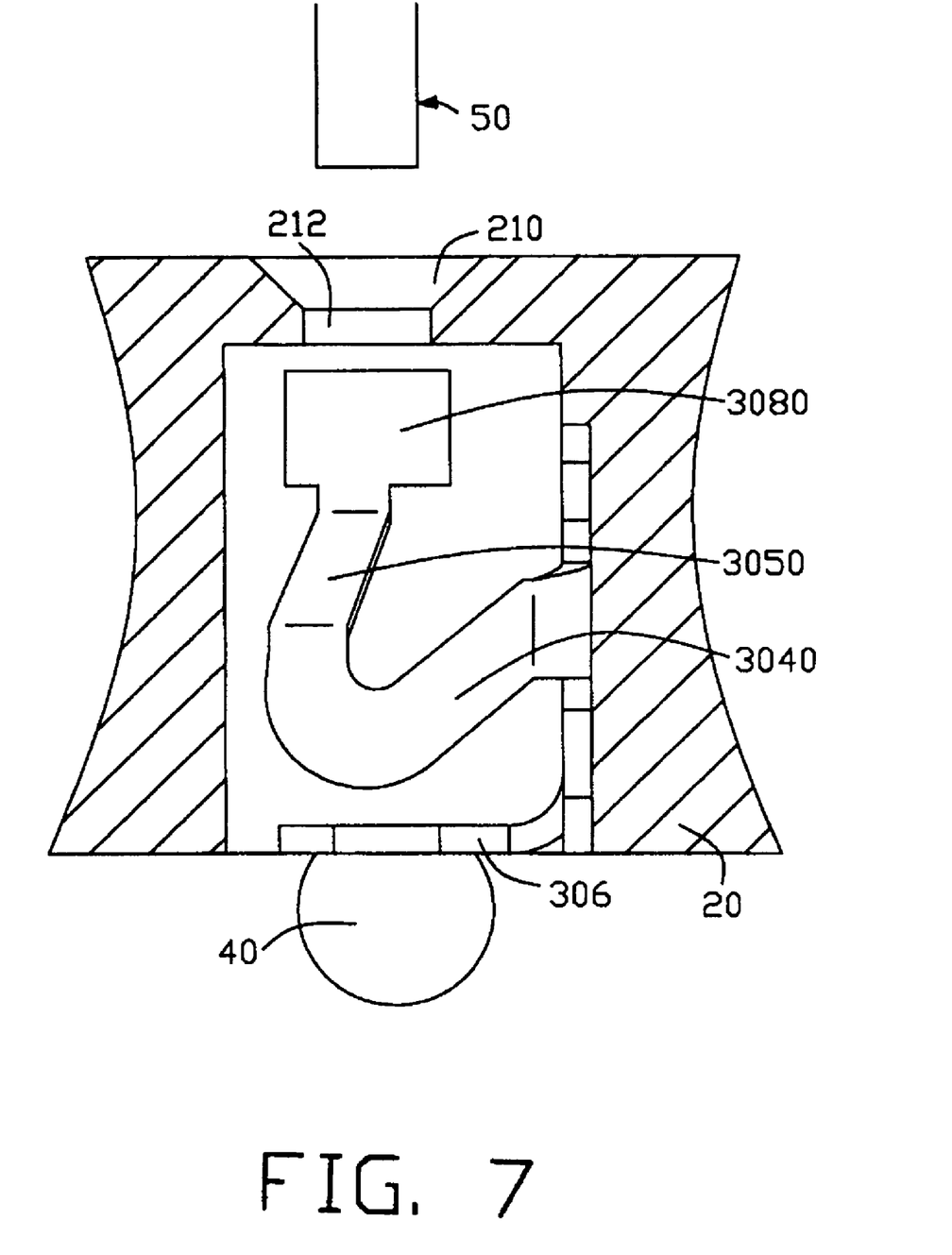
FIG. 7 is similar to FIG. 6, but showing an exemplary cross-sectional view of the low insertion force socket of FIG. 1 from another aspect.

Individual elements of the low insertion force socket 10 will now be described in greater detail. Referring to FIG. 5 through FIG. 7, the dielectric housing 20 is a planar rectangular configuration made of electrically dielectric material, such as resin or the like. The housing 20 includes an upper surface 202 to support a pin grid array package seated thereon, a lower surface 204 to be electrically coupled to a circuit substrate (not shown), and a number of through-holes extending through the upper surface 202 and the lower surfaces 204.

The through-holes each include an upper narrow lead-in channel 208 for compliantly receiving a pin 50 of the pin grid array package and a lower wide passage 206 in communication with the lead-in channel 208 for retaining a terminal 30 therein. The lead-in channel 208 includes a conical lead-in section 210 extending downwardly from the upper surface 202 and a columned connecting section 212 for connecting the lead-in section 210 to the passage 206. The passage 206 has an upper narrow passage 2061 for interferential securing the conductive terminal 30 in the low insertion force socket 10 and a lower wide passage 2062 associated with the upper narrow passage 2061 for interferential securing the conductive terminal 30 in the low insertion force socket 10 too. The upper narrow passage 2061 has a diameter smaller than that of the lower wide passage 2062. As an alternative form of the present embodiment, a number of standoffs 205 are preferably formed on the lower surface 204 of the housing 20, so as to prevent the housing 20 from being inclined relative to the circuit substrate during soldering procedure.

Figure 1:
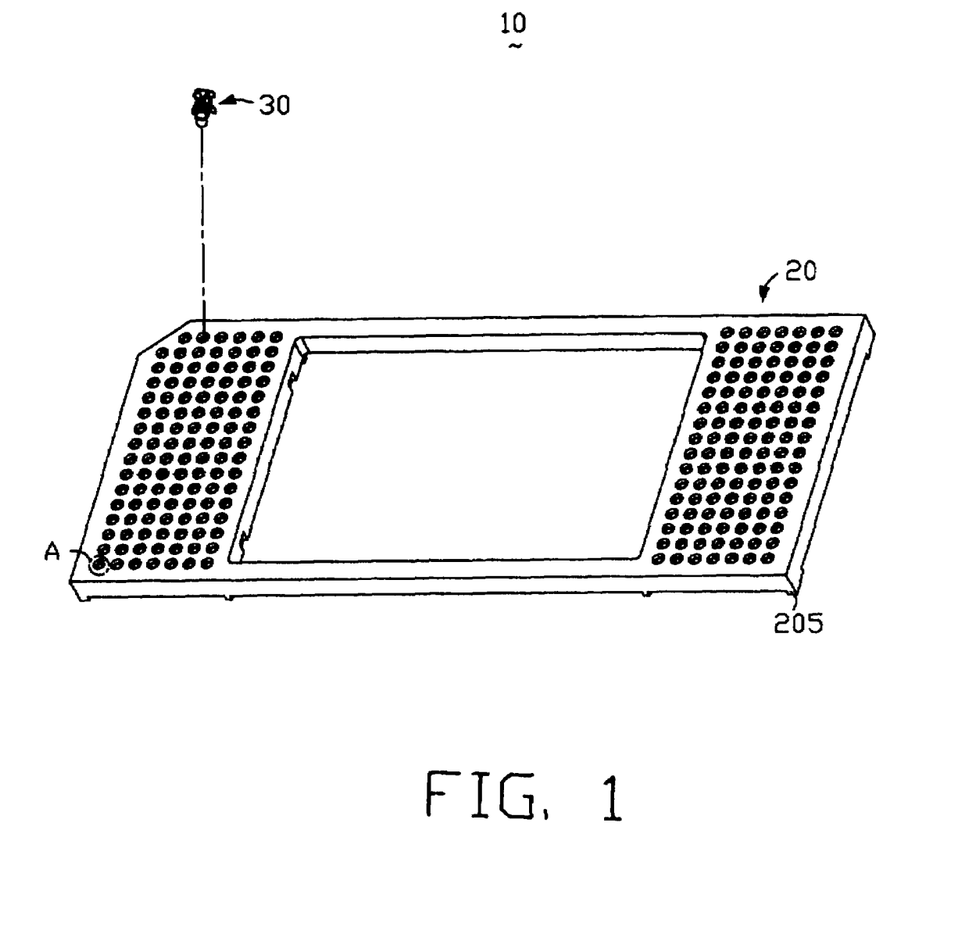
FIG. 1 depicts an exemplary assembled view of a low insertion force socket in accordance with one embodiment of the present invention, in which one of the terminals has not been secured in a dielectric housing thereof.
Figure 2:
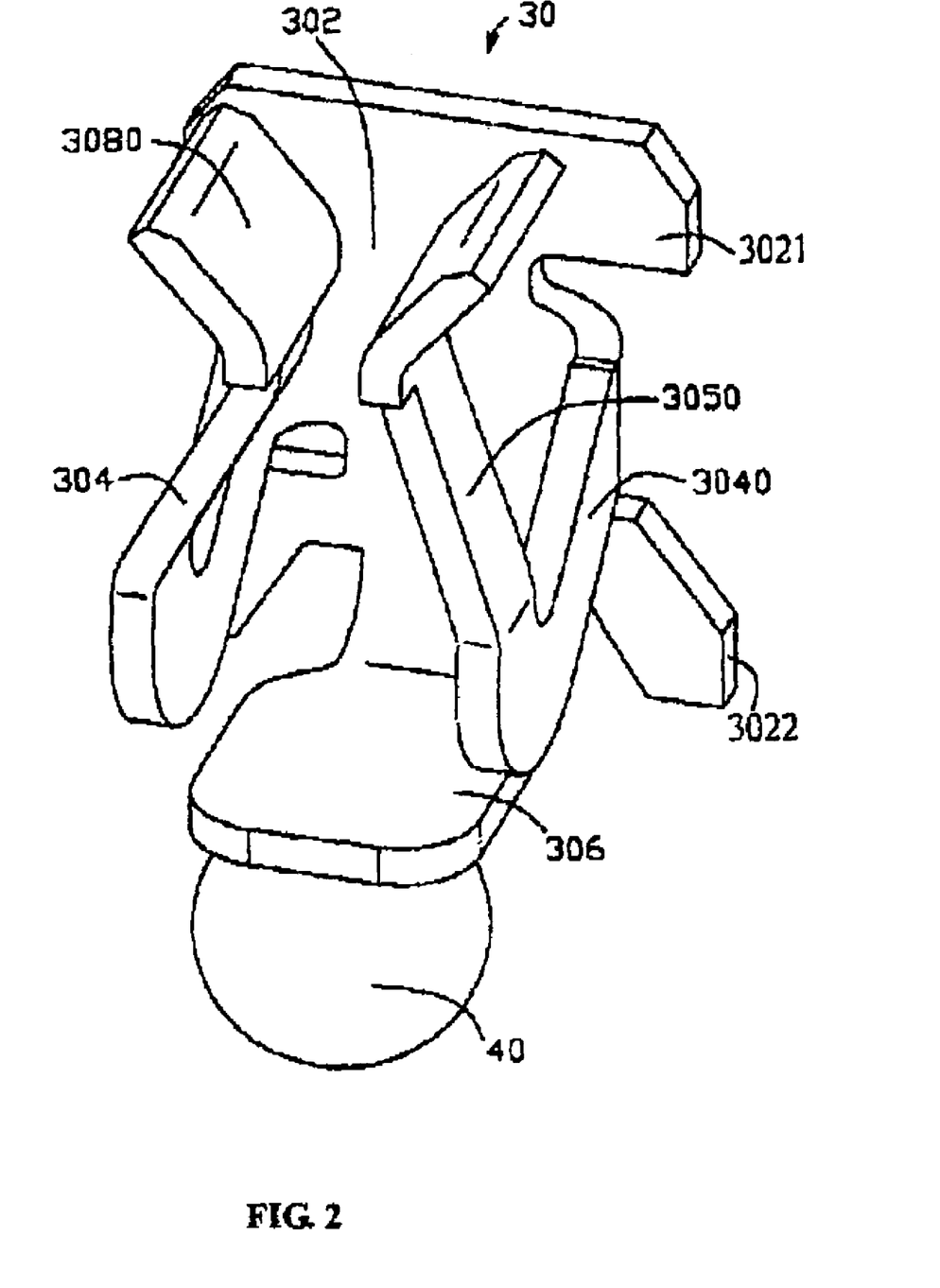
FIG. 2 depicts an exemplary enlarged view of the terminal shown in FIG. 1.
Figure 3:
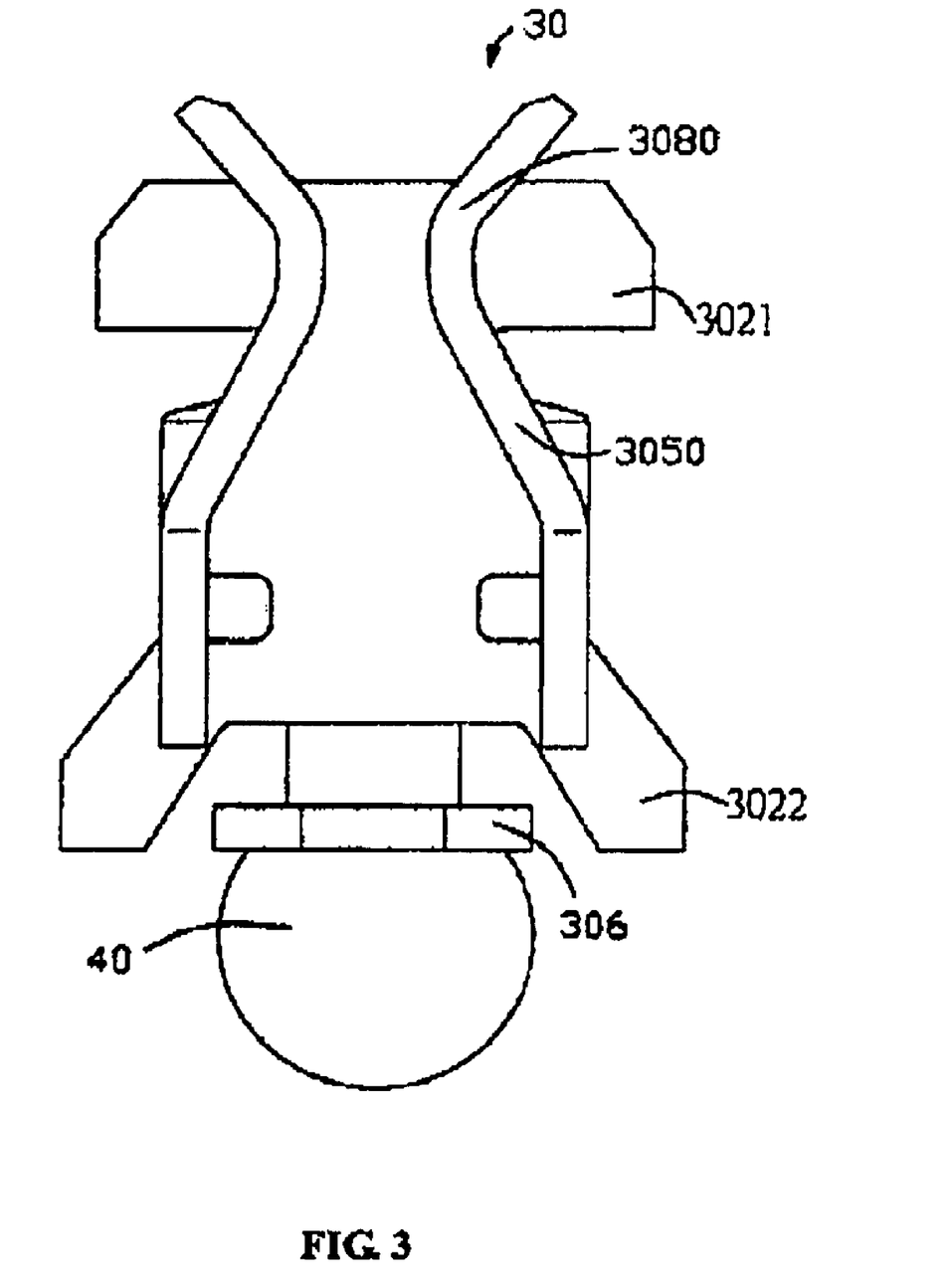
FIG. 3 depicts an exemplary front view of the terminal of FIG. 2.
Figure 4:
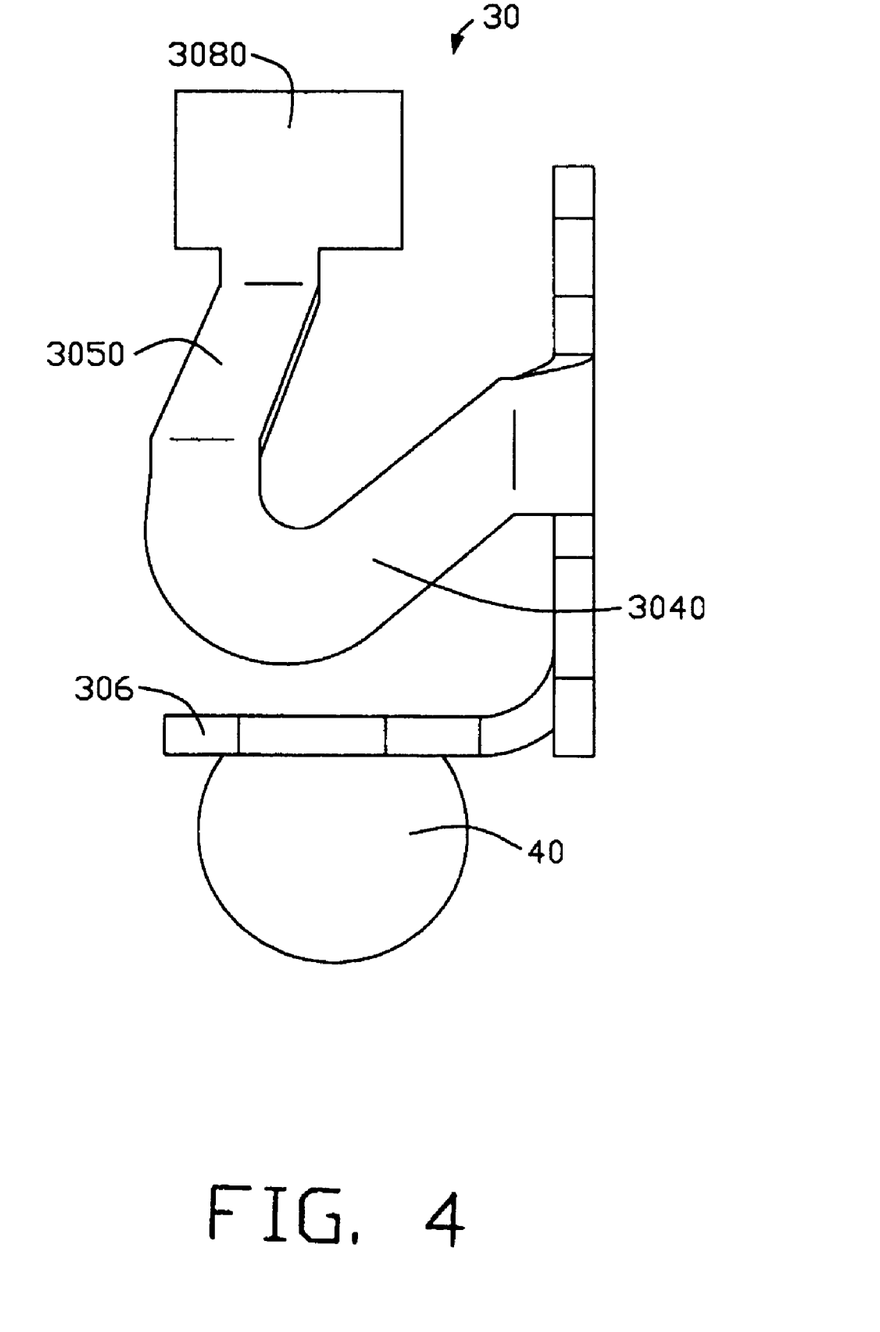
FIG. 4 depicts an exemplary side view of the terminal of FIG. 2.

Referring to FIG. 2 through FIG. 4, the conductive terminal 30 is formed from a sheet of metal material via stamping. Each terminal 30 includes a planar base section 302, a pair of opposing spring arms 304 stretching out from two lateral sides of the base section 302, and a planar solder pad 306 angled with respect to a lower end of the base section 302. The base section 302 is integrally formed with a pair of upper barbs 3020 at top portion of opposite lateral edges thereof for engaging with the upper narrow passage 2061 of the housing 20 and a pair of lower barbs 3021 at bottom portion of the opposite lateral edges thereof for abut against the lower wide passage 2062 of the housing 20 to reliably secure the terminal 30 to the housing 20. The upper barbs 3020 has a diameter smaller than that of the lower barbs 3021. The solder pad 306 is preferably perpendicular to the distal end of the base section 302 and can be electrically connected to the circuit substrate via a solder mass 40 attached thereto.

Each spring arm 304 includes an upper arm 3040 extending downwardly and obliquely toward the solder pad 306 and a lower arm 3050 extending upwardly and obliquely from a distal end of the upper arm 3040. The elongated flexural configuration of the spring arm 304 can improve flexibility thereof. The lower arms 3050 each define a smooth curved contacting section 3080 extending upwardly and outwardly from a distal end thereof to facilitate convenient insertion of the pin 50 of the pin grid array package. Referring particularly to FIG. 6 and FIG. 7, a topmost end of the contacting section 3080 is substantially above the base section 302 in a vertical direction.

Referring to FIG. 6 and FIG. 7, in assembly of the low insertion force socket 10, the terminals 20 are inserted into corresponding passages 206 along a bottom to top direction, respectively. When the terminal 30 is fully inserted in corresponding passages 206, the base section 302 of the terminal 30 is interferingly secured to the sidewalls of the passage 206. Topmost of the contacting sections 3080 of the terminal 30 are substantially located beneath the connecting section 212 in the vertical direction. On an unmated state, the distance, designated as D in FIG. 6, between two distal ends of the contacting sections 3080 is larger than the diameter of the connecting section 212.

The use and operation of the low insertion force socket 10 will now be recited in detail. Referring to FIG. 5 and FIG. 6, the low insertion force socket 10 is electrically mounted on the circuit substrate via the soldering mass 40. The pin grid array package is positioned on the low insertion force socket 10, with the pin 50 thereof being registered with a corresponding lead-in section 210 of the lead-in channel 208. The pin grid array package is pressed downwardly to urge the pin 50 thereof successively run through the lead-in section 210 and the connecting section 212 and into the passage 206. Within the passage 206, the pin 50 is resiliently clamped between the two smooth curved contacting sections 3080 of the terminal 30, thereby forming electrical connection between the pin 50 and the associated terminal 30.

In connection with the preceding description, the arrangement of the lead-in channels 208 of the low insertion force socket 10 according to one embodiment of the present invention can ensure smooth mating of the pins 50 of the pin grid array package and an associated terminal 30, which may prevent the terminal 30 from being damaged even in presence of improper manual insertion of the pin grid array package.

While the present invention has been illustrated by description of embodiment thereof, and while the embodiment have been described in considerable detail, it is not intended to restrict or in any way limit the scope of the appended claims to such details. Additional advantages and modifications in the spirit and scope of the present invention will readily appear to one skilled in the art. Therefore, the present invention is not limited to the specific details and illustrative examples shown and described.

The invention claimed is:

1. A low insertion force socket comprising:
a dielectric housing having an upper and bottom surface with a plurality of through-holes extending from the bottom surface toward the upper surface, the through-holes each comprising a lead-in channel extending downwardly from the upper surface and a passage in communication with the lead-in channel, and the lead-in channel having a diameter smaller than that of an associated passage; and
a plurality of conductive terminals residing in corresponding passages, respectively; and
wherein the passage has an upper narrow passage for interferential securing the conductive terminal in the socket and a lower wide passage associated with the upper narrow passage for interferential securing the conductive terminal in the socket.

2. The low insertion force socket of claim 1, wherein the conductive terminal comprises a base section retained in the passage, a pair of opposing spring arms each defining a smooth curved contacting section at a distal end thereof formed at two, sides of the base section, and a solder pad angled with respect to a lower end of the base section.

3. The low insertion force socket of claim 2, wherein the lead-in channel comprises a conical lead-in section and a columnar connecting section joining the lead-in section and the passage.

4. The low insertion force socket of claim 3, wherein each spring arm of the conductive terminal comprises an upper arm extending downwardly and obliquely from the base section and a lower arm extending upwardly and obliquely from a distal end of the upper arm.

5. The low insertion force socket of claim 4, wherein the columnar connecting section has a diameter smaller than a distance between two distal ends of the contacting sections of an associated conductive terminal.

6. The low insertion force socket of claim 2, wherein each contacting section extends upwardly and outwardly from a distal end of the spring arm.

7. The low insertion force socket of claim 2, wherein a topmost end of the contacting section is substantially above the base section in a vertical direction.

8. The low insertion for-e socket of claim 2, wherein the solder pad of the conductive terminal is perpendicular to a distal end of the base section.

9. The low insertion force socket of claim 2, wherein the conductive terminal forms a pair of upper barbs at top portion of opposite lateral edges of the base section and a pair of lower barbs at bottom portion of the opposite lateral edges of the base section;.

10. The low insertion force socket of claim 1, wherein tie housing is provided with a plurality of standoffs on a bottom surface thereof.

11. An electrical connector for receiving a pin grid array package, the electrical connector comprising:
a dielectric housing defining a plurality of apertures extending through a top and a bottom surfaces thereof, the apertures each comprising an upper narrow lead-in channel for compliantly receiving a pin of the pin grid array package and a lower wide passage has an upper narrow passage and a lower wide passage associated with the upper narrow passage in communication with the lead-in channel;
a plurality of conductive terminals retained in corresponding passages, respectively, each terminal comprising a pair of upper barbs at top portion of opposite lateral edges of the base section for engaging with the upper narrow passage to secure the terminals in the housing, a pair of lower barbs at bottom portion of the opposite lateral edges of the base section for engaging with the lower wide passage to secure the terminals in the housing, and a pair of opposing resilient arms located substantially beneath the lead-in channel to clamp an associated pin of the pin grid array package.

12. The electrical connector of claim 11, wherein the conductive terminal comprises a base section secured in the passage and a solder pad angled with respect to a lower end of the base section, the opposing resilient arms are formed at two lateral sides of the base section.

13. The electrical connector of claim 12, wherein each spring arm comprises an upper arm extending downwardly and obliquely from the base section and a lower arm extending upwardly and obliquely from a distal end of the upper arm.

14. The electrical connector of claim 13, wherein the lower arms each define a smooth curved contacting section extending upwardly and outwardly from a distal end thereof.

15. The electrical connector of claim 11, wherein the lead-in channel comprises a conical lead-in section and a columned connecting section connecting the load-in section to the passage.

16. The electrical connector of claim 11 wherein the connecting section of the lead-in channel has a diameter smaller than a distance between two distal ends of the contacting sections of the terminals.

* * * * *